United States Patent [19]

Cooper

[11] 4,274,537
[45] Jun. 23, 1981

[54] INTEGRATED CIRCUIT STORAGE CATALOG

[75] Inventor: Jerry D. Cooper, Odessa, Tex.

[73] Assignee: Cosmetex, Inc., Odessa, Tex.

[21] Appl. No.: 78,245

[22] Filed: Sep. 24, 1979

[51] Int. Cl.³ .................... B65D 73/02; B65D 85/38
[52] U.S. Cl. .................................. 206/329; 206/523; 206/472
[58] Field of Search ............... 206/331, 329, 328, 523, 206/472

[56] References Cited

U.S. PATENT DOCUMENTS

| | | | |
|---|---|---|---|
| 2,518,450 | 8/1950 | Cowen et al. | 206/329 |
| 2,998,130 | 8/1961 | Lehner | 206/329 |
| 4,157,757 | 6/1979 | Gallaher, Jr. | 206/328 |

*Primary Examiner*—William T. Dixson, Jr.
*Attorney, Agent, or Firm*—Marcus L. Bates

[57] ABSTRACT

A convenient storage catalog especially adapted to safely and efficiently store integrated circuit chips. The chips are removably mounted in a cataloged position upon a sheet of bendable material. The individual sheets of material have indicia formed thereon which divides either of the opposed faces of the sheet into a plurality of adjacent areas. Each of the areas further have indicia formed thereon related to the identification of the particular integrated circuit chip mounted thereon. The individual areas are of sufficient size to receive a plurality of integrated circuit chips. A plurality of sheets may be joined at one edge thereof to provide a loose leaf book, or alternatively, the sheets may be assembled within an enclosure to provide a filing cabinet.

9 Claims, 6 Drawing Figures

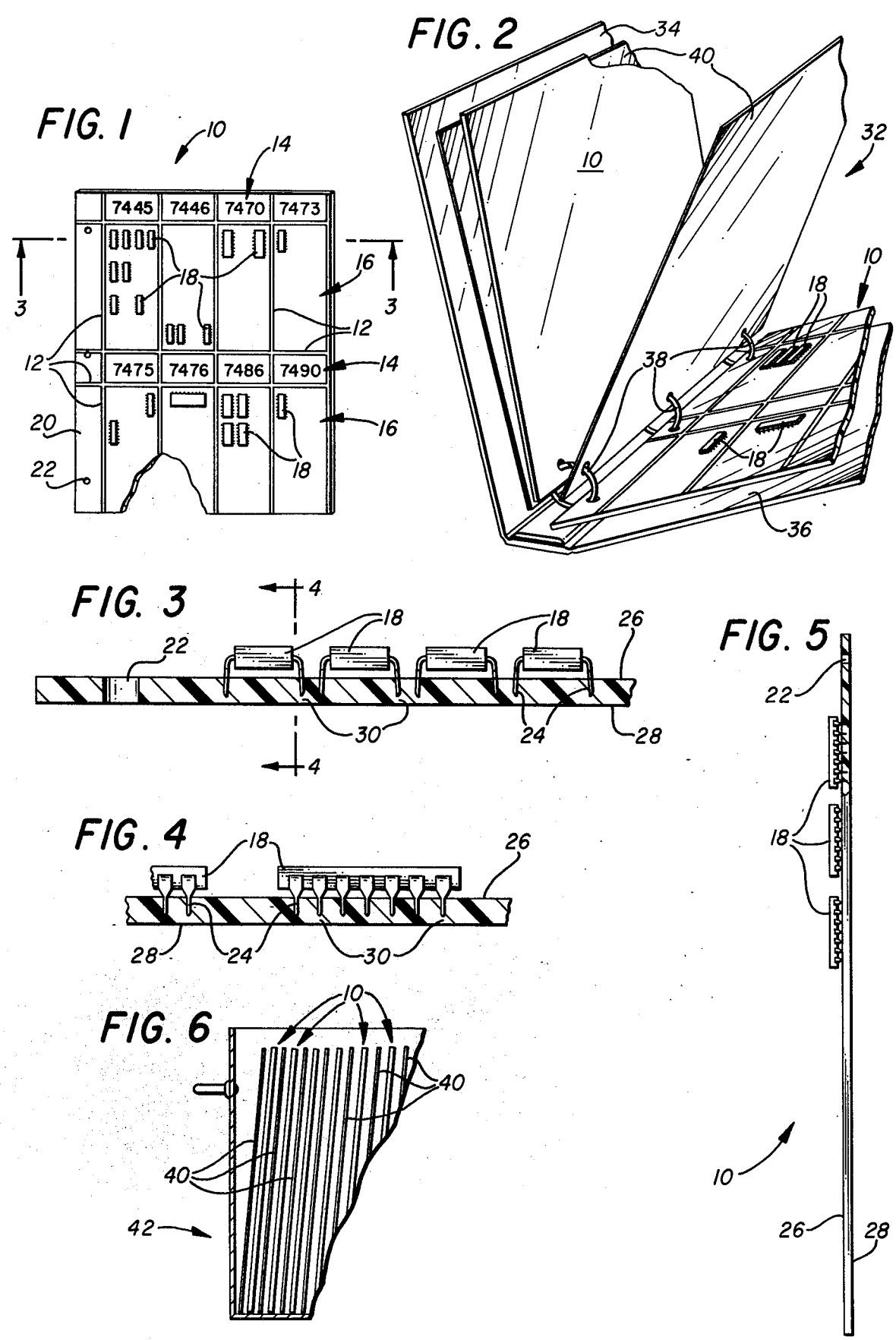

INTEGRATED CIRCUIT STORAGE CATALOG

BACKGROUND OF THE INVENTION

Integrated circuit chips, because of their irregular shape, are difficult to handle and store. A small handful of chips represents a considerable amount of money. It is unwise to store a multiplicity of the chips in a single enclosure, because the terminal ends or electrical contacts thereof become intermeshed and locked together. Furthermore, the chips, when stored in this random manner, are likely to be damaged from shock and are difficult to identify and retrieve. In order to overcome some of these difficulties, Cowen et al, U.S. Pat. No. 2,518,450, proposes to mount the prongs of fragile articles within an apertured support member and enclose the combination within a box.

Anson, U.S. Pat. No. 3,746,157; Bohannon, U.S. Pat. No. 3,700,100; Hutson, U.S. Pat. No. 3,946,864; Lechner et al, U.S. Pat. No. 4,057,142; Jackson, U.S. Pat. No. 3,191,791 and Emery, U.S. Pat. No. 2,778,490, each propose to store fragile components in individual enclosures isolated from one another.

Berge et al, U.S. Pat. No. 3,164,794, encapsulates various different circuit components, each electrically connected to one another, and with the different components being molded within a sheet of material 12 which essentially provides a book 15 which can be placed within a zipped enclosure 19.

Gerner, U.S. Pat. No. 3,552,595, proposes a plurality of panels of resilient, synthetic, sheet plastic material connected together so that the panels may be folded respective to one another and conveniently stored.

Wallestad, U.S. Pat. No. 3,494,459, proposes a plurality of panels 10 which are chip trays nested together to provide a convenient storage means for fragile components.

It is evident from the foregoing prior art examples that various different expedients have been employed to protect fragile circuit components, and at the same time maintain the components separated from one another in some sort of systematic manner. An improvement over the prior art which provides an integrated circuit storage catalog is the subject of the present invention.

SUMMARY OF THE INVENTION

This invention relates to an integrated circuit storage catalog for storage of a plurality of integrated circuit chips, wherein each of the chips has a plurality of electrical contacts or prongs which extend in like direction in spaced relationship to one another. The catalog comprises a sheet of bendable, plastic material, as for example foamed polyethylene and foamed polypropylene, having a thickness which is greater than the length of the terminals of the chips.

Indicia separates one face of the sheet into a plurality of areas, and another other indicia identifies the plurality of chips to be stored within a particular area.

The terminals of the chips are forced into the sheet of material until the base of the chip abuttingly engages the face of the sheet. The chips are arranged in spaced relationship respectively to one another, and within the appropriate area, where the chips are individually, releasably attached to the sheet by the frictional forces developed as a result of the terminals being forced into the plastic sheet material.

In one embodiment of the invention, a plurality of sheets are joined along a common edge portion to provide a book of parts. The outer covers of the book are provided with a zipper thereon so that the sheets which comprise the catalog are protectively enclosed. Alternatively, the sheets of the catalog may be stored in sandwiched relationship within a file cabinet or the like. A data sheet may be interposed between each of the chip-supporting sheets, with the data sheets having indicia formed thereon related to the electronic characteristics of the individual chips.

Accordingly, a primary object of the present invention is the provision of an integrated circuit storage catalog upon which a plurality of integrated circuit chips are stored in spaced relationship to one another.

Another object of the invention is to provide an integrated circuit storage catalog made of sheets of foamed, plastic-like material which releasably engages the terminals of an integrated circuit chip so that the chips may be arranged in an indexed and cataloged manner in supported relationship upon the sheet.

A further object of this invention is to disclose and provide a catalog which is formed of sheets of bendable, foamed plastic material, with the individual sheets each supporting a plurality of chips, and with the chips being arranged in a cataloged manner on either face of the sheet.

A still further object of this invention is to provide an integrated circuit catalog in the form of a book made of sheets of bendable, plastic material which supportingly receives a plurality of integrated circuit chips thereon, and with the chips arranged separated from one another in a cataloged manner.

Another and still further object of the present invention is to disclose and provide an integrated circuit storage catalog in the form of a file cabinet having a plurality of sheets of bendable, foamed plastic material contained therewithin, with each sheet having a face which receives a plurality of integrated circuit chips in a cataloged manner thereon.

These and various other objects and advantages of the invention will become readily apparent to those skilled in the art upon reading the following detailed description and claims and by referring to the accompanying drawings.

The above objects are attained in accordance with the present invention by the provision of a combination of elements which are fabricated in a manner substantially as described in the above abstract and summary.

BRIEF DESCRIPTION OF THE DRAWINGS

FIG. 1 is a front perspective view showing part of a catalog made in accordance with the present invention;

FIG. 2 is a fragmentary, perspective view of a catalog made in accordance with the present invention;

FIG. 3 is an enlarged, broken, cross-sectional view taken along line 3—3 of FIG. 1;

FIG. 4 is a broken, cross-sectional view taken along line 4—4 of FIG. 3;

FIG. 5 is a longitudinal, part cross-sectional side view of the apparatus disclosed in FIG. 1; and, FIG. 6 is a broken, part cross-sectional side view of another embodiment of the present invention.

DETAILED DESCRIPTION OF THE PREFERRED EMBODIMENT

The figures of the drawings illustrate an integrated circuit storage catalog, made in accordance with the present invention. As seen in FIGS. 1 and 3-5, the catalog is comprised of a sheet of bendable material 10, such as foamed plastic and preferably foamed polyethylene or foamed polypropylene. One face of the sheet is provided with indicia which forms horizontal and parallel lines 12. The indicia also provides data 14 related to the identity of the integrated circuit chips which may be removably fastened in supported relationship within each of the areas 16. Hence, the indicia provides the sheet with a plurality of contingent areas 16, each having identification 14 related to the electrical characteristics of a plurality of integrated circuit chips 18 which may be stored thereon. The area 16 preferably is of a size to receive a plurality of like chips thereon, and it is preferred that a plurality of areas 16 be applied to one face of the bendable sheet.

The marginal edge portion 20 of the sheet is apertured at 22. The chips each have the usual downwardly depending prongs 24, or electrical contacts, which usually depend from the chips in like directions, and which are usually more or less parallel to one another.

The upper face 26 of the sheet is opposed to the opposite or lower face 28. The sheet is of sufficient thickness so that when the lowermost face of the chip abuttingly engages face 26 of a sheet, a significant clearance 30 remains between the lower face of the sheet and the terminal free end portion of the prongs.

In FIG. 2, a plurality of sheets 10 have been assembled into a book 32. The book includes a front cover 34, a rear cover 36, and a plurality of snap rings 38. The rings are received within the before mentioned apertures 22 and releasably affix each of the sheets to the book so that the sheets are releasably captured respective thereto.

In the book 32, alternate pages 40 may be a data page related to the electrical characteristics of chips to be found on an adjacent page. Accordingly, it is advantageous to provide the catalog 32 with a plurality of sheets of bendable plastic material 10, and a plurality of data sheets 40, with the data sheets being sandwiched between the adjacent sheets of bendable plastic material.

FIG. 6 illustrates a filing cabinet 42, which can take on a number of different forms. The sheets of the catalog 10 are sandwiched between the sheets of data pages 40, thereby enabling the electrical characteristics of the chips to be rapidly ascertained.

In operation, the indicia 12 is printed onto one face of the sheet 10. The sheet 10 is foamed plastic, and preferably foamed polyethylene, polypropylene, polystyrene, and graphite impregnated foamed plastic; the latter being desirable for circuits which are easily damaged by static charges. Each sheet is provided with a multiplicity of areas 16 related to a single chip. A plurality of chips are supported within each of the areas 16 by pressing the chips into the material so that the terminals are firmly held within the body of the sheet due to the frictional forces which result from the prongs penetrating the plastic material. The chips are arranged in parallel aligned relationship respective to one another to thereby provide several rows of like chips mounted on a single area 16.

The integrated circuit storage catalog of the present invention enables a tremendous number of chips to be safely and efficiently stored and transported without danger of damage or loss. When a particular chip is desired, an index (not shown) can be consulted, the appropriate sheet 10 consulted and the desired chip selected from the appropriate area 16. If desired, the circuit characteristics of the chip can be consulted on an adjacent data page 40. The chips are easily removed from the sheet by grasping the chip body between one's thumb and forefinger and pulling the prongs from the sheet.

The present apparatus provides a method by which a constant inventory can be carried in stock, and when one of the areas becomes almost depleted, it is obviously time to reorder new chips. The new chips can be replaced into the sheet by pressing the terminals of the new chips into the old location.

The present invention enables a large number of chips to be stored in a very small area. It is possible to transport 200 or more I.C. chips in a catalog which will fit within one's inside coat pocket. Since the identification number on the chip is "face up", hundreds of chips are viewed and are accessible at a flip of the sheet, or page, of the catalog. Hence, identification and retrieval time is minimized.

I claim:

1. An integrated circuit storage catalog for storage of a plurality of integrated circuit chips, wherein each of the chips includes a body from which a plurality of electrical contacts extend in like direction, in spaced relation to one another;

said catalog comprises a sheet of bendable plastic material having a thickness greater than the length of the contacts; means forming indicia on one face of said sheet which provides said face of said sheet with a plurality of areas;

a plurality of like chips mounted within one said area, the contacts of each chip being forced into said sheet until the chip body abuts the face of the sheet, thereby releasably attaching the chip to the face of the sheet;

said indicia is also applied to each said area to indicate the characteristics of the chip stored thereon.

2. The storage catalog of claim 1 wherein there is included a plurality of said sheets, means by which each said sheets is attached along one edge portion thereof to form a book of said sheets.

3. The storage catalog of claim 2 wherein indicia is applied to each side of said sheet, and further including a data page interposed between said sheets, indicia formed on said data page which is related to the electrical characteristics of the chips supported on said sheets.

4. The storage catalog of claim 1 wherein said sheet is made of foamed plastic, and further including a plurality of said sheets arranged in superimposed relationship and contained within an enclosure to provide a file.

5. The storage catalog of claim 4 and further including a data page interposed between said sheets, indicia formed on said data page which is related to the electrical characteristics of the chips supported on the adjacent sheet.

6. The storage catalog of claim 1 wherein there is included a plurality of said sheets, each said sheet being attached along one edge portion thereof to form a book of sheets; and further including a data page interposed between said sheets, indicia formed on said data page which is related to the electrical characteristics of the chips supported on the adjacent sheet;

said sheet being made from foamed plastic selected from the group consisting of: polyethylene, polypropylene, and polystyrene.

7. A storage catalog in combination with integrate circuit chips wherein each chip has a main body from which there downwardly depends a plurality of spaced apart electrical terminals;

said catalog being a sheet of bendable foamed plastic and having a thickness at least equal to the length of the terminals which extend from said main body;

said sheet having a top, a bottom, spaced sides, and opposed faces;

said terminals of said chips being forced to penetrate into said sheet until the body of the chip abuttingly engages the face of the sheet; and means, including indicia, identifying the chips located on said sheet.

8. The storage catalog of claim 7 wherein there is included a plurality of said sheets, means by which each said sheet is attached along one edge portion thereof to form a book of said sheets.

9. The storage catalog of claim 8 and further including a data page interposed between said sheets, indicia formed on said data page which is related to the electrical characteristics of the chips supported on the adjacent said sheet.

* * * * *